United States Patent [19]

Gutierrez et al.

[11] 3,959,038

[45] May 25, 1976

[54] ELECTRON EMITTER AND METHOD OF FABRICATION

[75] Inventors: William A. Gutierrez; Herbert L. Wilson, both of Woodbridge, Va.

[73] Assignee: The United States of America as represented by the Secretary of the Army, Washington, D.C.

[22] Filed: Apr. 30, 1975

[21] Appl. No.: 573,288

[52] U.S. Cl. .......... 148/171; 148/172; 148/175; 148/1.5; 148/33.5; 252/62.3 GA; 357/29; 313/95; 156/17

[51] Int. Cl.² .......... H01L 7/36; H01L 7/38; H01L 7/54

[58] Field of Search .......... 148/171, 172, 175, 33.5, 148/1.5; 252/62.3 GA; 357/29; 313/95; 156/17

[56] References Cited

UNITED STATES PATENTS

| | | | |
|---|---|---|---|
| 3,478,213 | 11/1969 | Simon et al. | 313/95 X |
| 3,672,992 | 6/1972 | Schaefer | 148/171 X |
| 3,762,968 | 10/1973 | Kressel et al. | 148/171 |
| 3,862,859 | 1/1975 | Ettenberg et al. | 148/171 |
| 3,901,744 | 8/1975 | Bolger et al. | 148/171 |
| 3,901,745 | 8/1975 | Pion | 148/171 |
| 3,914,136 | 10/1975 | Kressel | 148/171 |

*Primary Examiner*—G. Ozaki
*Attorney, Agent, or Firm*—Nathan Edelberg; Milton W. Lee; Robert P. Gibson

[57] ABSTRACT

Transmission mode negative electron affinity gallium arsenide (GaAs) photocathodes and dynodes and techniques for the fabrication thereof, utilizing multilayers of GaAs and gallium alluminum arsenide (GaAlAs) wherein the GaAs layer serves as the emitting layer and the GaAlAs serves as an intermediate construction layer and/or as an integral part of the component.

10 Claims, 1 Drawing Figure

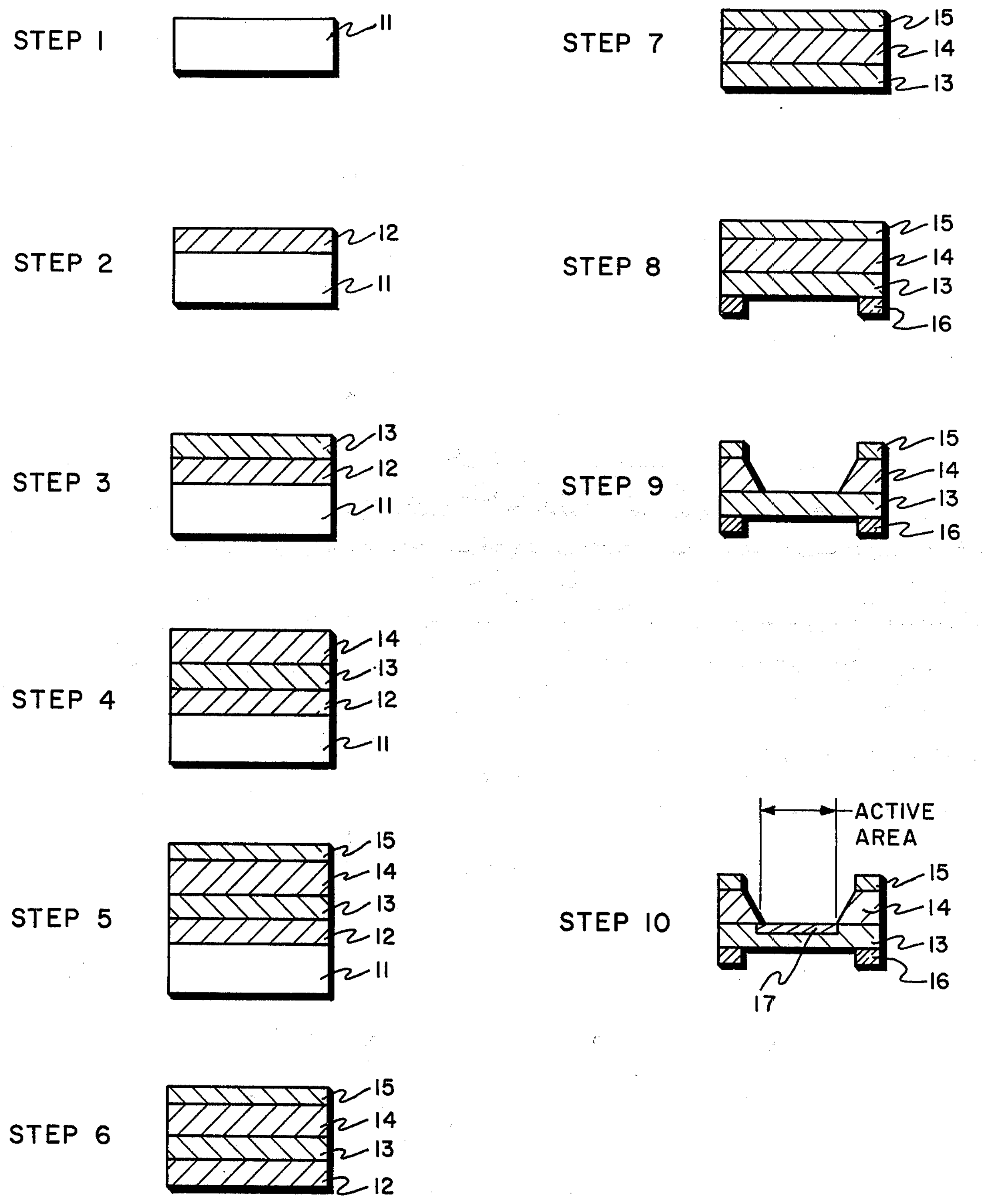
STEP 1
11
STEP 2
12
11
STEP 3
13
12
11
STEP 4
14
13
12
11
STEP 5
15
14
13
12
11
STEP 6
15
14
13
12
STEP 7
15
14
13
STEP 8
15
14
13
16
STEP 9
15
14
13
16
STEP 10
ACTIVE AREA
15
14
13
16
17

ELECTRON EMITTER AND METHOD OF FABRICATION

The invention described herein may be manufactured, used, and licensed by or for the Government for governmental purposes without the payment to us of any royalty thereon.

BACKGROUND OF INVENTION

This invention disclosure relates to electron emitters and more specifically to transmission mode negative electron affinity photocathodes and dynodes (secondary emissive devices). Photocathodes convert impinging radiation into a corresponding electron image whereas secondary emissive devices provide electron multiplication. Due primarily to the fragile nature of transmission mode negative electron affinity photocathodes and dynodes and the difficulty encountered in the fabrication thereof, commercial applicability and acceptability has been slow in materializing.

Electron emitting components, based on the negative electron affinity effect in cesium-oxygen treated single crystal semiconductor surfaces, have significantly better performance than conventional emitters in terms of sensitivity and resolution primarily due to their longer escape depths, higher escape probabilities, and narrower exit energy distributions. For a large number of pick-up tube applications (i.e., photomultipliers, television camera tubes, image intensifiers, etc.) transmission mode operation is required because this mode of operation greatly simplifies both the light and electron optics, thereby resulting in smaller and less expensive tubes.

SUMMARY OF THE INVENTION

This invention relates to a method of constructing high performance transmission mode GaAs photocathodes and dynodes wherein GaAlAs is used as a passivating window support layer and/or as an etch stop layer. The advantage of using GaAlAs in the construction of GaAs electron emitters lies in the fact that the lattice parameter and thermal expansion coefficient of the two materials match very closely. In multilayer structures, such as those described in this invention, this matched condition reduces the dislocations and strains in the bulk of the layers as well as at their interfaces, leading to improved crystalline quality and enhanced device performance. In addition, the difference in the etching behavior, optical transmission, and energy bandgap between GaAs and GaAlAs enables preferential etching and passivation to be performed, thus significantly facilitating device construction.

IN THE DRAWING

The single FIGURE shows the several steps envisioned in alternatively fabricating a photocathode and dynode with steps 1 through 8, inclusive, disclosing one procedure for fabricating a photocathode and steps 9 and 10 disclosing a further refinement of the process resulting in a wide band photocathode and dynode.

DETAILED DESCRIPTION

The various steps in the fabrication of a transmission mode photocathode and of a dynode as envisioned herein can best be understood by reference to the drawing wherein like reference characters designate like or corresponding layers of material throughout the several views.

The following procedure describes a method for constructing a high sensitivity high resolution GaAs transmission mode photocathode. With a few additional processing steps, an improved transmission mode dynode can be constructed which will function as a broadband transmission photocathode, as well as a secondary emissive device. The fabrication process is described with the aid of the single FIGURE.

In step 1 a p-doped GaAs seed crystal 11, oriented with the (100) crystallographic face exposed, approximately 15 mils thick and 18–25 mm in diameter, is prepared for expitaxial growth by chemically polishing the growth surface in a $5H_2SO_4$: $1H_2O_2$: $1H_20$ etch to remove any residual mechanical damage introduced by previous mechanical polishing steps. In step 2 a 2 – 50 micron thick $Ga_xAl_{1-x}As$ ($0.4 \leq X \leq 0.7$) etch stop layer 12 doped n-type with group VI elements (i.e., tellurium, selenium, or sulfur) in the range 0.5 – 5 × $10^{17}cm^{-3}$ is epitaxially grown on seed crystal 11. Layer 12 is grown either by liquid phase technique using any of a number of conventional methods (i.e., dipping, tipping, or sliding) or by open tube vapor phase technique using organometallic reagents (i.e., trimethylgallium and trimethylaluminum) as the source of the group III elements and the hydride of arsenic and selenium (i.e., arsine; hydrogen selenide) as the source of the group V element and n-type dopant respectively. In step 3 a 1–2 micron thick p-doped (approx. 5 × $10^{18}cm^{-3}$) GaAs emitter layer 13 is epitaxially grown onto layer 12 by either liquid or vapor phase technique. In step 4 a $Ga_yAl_{1-y}As$ ($0.3 \leq y \leq 0.7$) passivating window layer 14 lightly p-doped ($5 \times 10^{17}cm^{-3}$), is epitaxially grown on layer 13 to a thickness of 100 microns or greater by either liquid or vapor phase technique using procedures similar to that described in step 2 except that the n-dopant material is replaced by a p-dopant material such as zinc or germanium. In step 5, an appropriate antireflection coating 15 (i.e., silicon dioxide, silicon nitride, or suitable multilayer composite) is applied by any well known method such as chemical vapor deposition, RF sputtering or vacuum evaporation, to a thickness of approximately 1000 angstroms, onto layer 14 to reduce the amount of reflected light loss from the photon receiving side of the structure. It is noted that in the case where layer 12 and/or layer 14 are not grown smooth, they can be properly polished and etched to produce planar specular surfaces before the next layer is grown on them. In step 6 seed crystal 11 is removed completely either by preferentially etching layer 11 away from layer 12 in a 0.2M KOH solution by electrochemical process or by lapping and polishing techniques. Both seed crystal 11 and etch stop layer 12 are used for construction purposes only and are not intended to be an integral part of the finished device. During the fabrication process seed crystal 11 is necessary for providing strength as a substrate support upon which the other layers of the device are grown, while layer 12 is very thin and provides an etch-stop layer for protecting the GaAs layer 13 from chemical damage during the etch removal of substrate 11. Since the sole purpose of the etch-stop layer 12 is to protect layer 13 during removal of layer 11, then the etch-stop layer 12 will serve no further purpose and must also be removed. In step 7 the etch stop layer 12 is preferentially etched away from the photoemitting layer 13 with HCl to expose the electron emitting surface of layer 13 and in step 8 an ohmic contact ring 16 is applied by evaporation of sputtering to a selected portion of the surface of layer 13 such that electrical connections can be made to the photocathode structure. The diagram in step 8 shows the completed photocathode structure consisting of layers 13, 14, 15 and 16 with layer 15 being the photon receiving side and layer 13 the electron emitting side.

To form a transmission mode dynode structure, layer 13 of the resultant device of step 8 may be made self-standing by preferentially etching layer 14 away from layer 13 in the desired active region while leaving a portion of layer 14 on the periphery of the structure as a ring mechanical support for layer 13 as shown in step 9. Layer 14 is etched away from layer 13 in concentrated HCl which preferentially etches GaAlAs from GaAs. The insulating antireflection coating 15 is used as a mask to define the active region using standard photolithographic techniques. Finally, to minimize the backsurface recombination velocity and improved device performance, a highly p-doped (approx. $5 \times 10^{20}cm^{-3}$) skin 17 can be ion implanted by standard techniques to a depth of approximately 1000 angstroms into the input side of the dynode as shown in step 10. The diagram in step 10 shows the completed dynode structure with skin 17 being the imput side for receiving primary electrons with the surface opposite skin 17 being the exit surface for the generated secondary electrons.

When a photocathode is constructed according to the process described above and the GaAs layer is activated to a state of negative electron affinity by heat cleaning in vacuum and applying by well known techniques, mono layer amounts of cesium and oxygen, it exhibits higher photosensitivity and better imaging properties than conventional multialkali type photocathodes. The dynode, activated in the same manner as the photocathode, exhibits improved electron multiplying characteristics over conventional thin film dynodes. It is noted that the dynode strucutre can also operate satisfactorily as a broadband photocathode since it does not have the filtering characteristics of the GaAlAs window layer. When the dynode is used as a photocathode, layer 17 functions as the light incident side and the opposite surface becomes the electron emittig side.

It should be understood, of course, that the foregoing disclosure relates to only a preferred embodiment of the invention and that numerous modifications or alterations may be made departing from the spirit and the scope of the invention as set forth in the appended claims.

We claim:

1. A method of fabricating a transmission mode gallium arsenide electron emitter comprising the steps of:

epitaxially growing an etch stop layer of lightly n-doped gallium aluminum arsenide onto one surface of a p-doped gallium arsenide seed crystal;

epitaxially growing a p-doped gallium arsenide emitting layer onto the etch stop layer;

epitaxially growing a lightly p-doped gallium aluminum arsenide passivating window layer onto the emitting layer;

preferentially removing the gallium arsenide seed crystal from the gallium aluminum arsenide etch stop layer;

preferentially removing the etch stop layer of gallium aluminum arsenide from the gallium arsenide electron emitting layer; and providing ohmic contact means for the exposed surface of the emitting layer.

2. A method of fabricating a transmission mode electron emitter as recited in claim 1, wherein the seed crystal is chosen to be approximately 15 mils thick and the growth of the etch stop layer is held within a range of 2 – 50 microns, growth of the emitter layer is held to a thickness of 1 – 2 microns and growth of the passivatig window layer reaches at least 100 microns.

3. A method of fabricating a transmission mode electron emitter as recited in claim 1 further comprising the application of an antireflection coating to the passivating window layer.

4. A method of fabricating a transmission mode electron emitter as recited in claim 3 wherein removal of the gallium arsenide seed crystsl is effected by preferential etching in a 0.2M KOH solution by electrochemical processing.

5. The method of claim 4, wherein the preferential removal of the etch stop layer of gallium aluminum arsenide is effected by etching with HCl.

6. The method of claim 3 wherein the emitter layer is made self-standing by the preferential etching away of portions of the antireflection coating and passivating layer in a desired active region while leaving a portion of the passivating layer on the periphery of the structure as a mechanical support ring for the emitter layer.

7. The method of claim 6, wherein the selective etching away of the passivating layer is effected by a concentrated HCl etch.

8. The method of claim 7, wherein backsurface recombination velocity is minimized by ion implantation in the active region to a depth of approximately 1000 angstroms.

9. The photocathode resulting from the practice of the fabrication method of claim 6.

10. The photocathode resulting from the practice of the fabrication method of claim 1.

* * * * *